(12) United States Patent
Zeng et al.

(10) Patent No.: US 10,915,208 B2
(45) Date of Patent: Feb. 9, 2021

(54) TOUCH SUBSTRATE, FABRICATION METHOD, TOUCH DISPLAY PANEL, AND TOUCH DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Ting Zeng, Beijing (CN); Ming Hu, Beijing (CN); Xianlin Ding, Beijing (CN); Qingpu Wang, Beijing (CN); Guiyu Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 891 days.

(21) Appl. No.: 15/757,918

(22) PCT Filed: Aug. 14, 2015

(86) PCT No.: PCT/CN2015/087024
§ 371 (c)(1),
(2) Date: Mar. 6, 2018

(87) PCT Pub. No.: WO2016/086688
PCT Pub. Date: Jun. 9, 2016

(65) Prior Publication Data
US 2018/0341348 A1    Nov. 29, 2018

(30) Foreign Application Priority Data

Dec. 4, 2014 (CN) .......................... 2014 1 0735116

(51) Int. Cl.
*C23C 14/34* (2006.01)
*G06F 3/044* (2006.01)
(Continued)

(52) U.S. Cl.
CPC ........ *G06F 3/0443* (2019.05); *C23C 14/0036* (2013.01); *C23C 14/08* (2013.01);
(Continued)

(58) Field of Classification Search
CPC .................................................. C23C 14/0036
See application file for complete search history.

(56) References Cited

U.S. PATENT DOCUMENTS

2012/0081333 A1   4/2012  Ozeki et al.
2014/0015771 A1*  1/2014  Shin ........................ G06F 3/044
                                                345/173
(Continued)

FOREIGN PATENT DOCUMENTS

CN       101893975 A     11/2010
CN       102446047 A      5/2012
(Continued)

OTHER PUBLICATIONS

International Search Report dated Aug. 14, 2015, issued in counterpart International Application No. PCT/CN2015/087024 (16 pages).

*Primary Examiner* — Jason Berman
(74) *Attorney, Agent, or Firm* — Westerman, Hattori, Daniels & Adrian, LLP

(57) ABSTRACT

The present disclosure provides a touch substrate. A plurality of first electrodes (11) spaced apart by a first predetermined distance along a first direction is formed over a substrate (5), with adjacent first electrodes (11) mutually connected via a connection part (111). A plurality of second electrodes (12) spaced apart by a second predetermined distance along a second direction is formed over the sub-
(Continued)

strate (5), with adjacent second electrodes (12) mutually connected via a bridging element (3). An insulating layer (2) is formed between the bridging element (3) and the connection part (111). The insulating layer (2) is formed by oxidizing a metal element sputtered from a target, which is used to form one or more of the connection part (111) and the bridging element (3), in an ambient with oxygen so as to form a metal oxide layer over one of the connection part (111) and the bridging element (3).

19 Claims, 4 Drawing Sheets

(51) Int. Cl.
*C23C 14/00* (2006.01)
*C23C 14/08* (2006.01)
*C23C 14/16* (2006.01)
*C23C 14/35* (2006.01)

(52) U.S. Cl.
CPC ............ *C23C 14/165* (2013.01); *C23C 14/35* (2013.01); *G06F 3/0446* (2019.05); *G06F 2203/04103* (2013.01); *G06F 2203/04111* (2013.01)

(56) References Cited

U.S. PATENT DOCUMENTS

| | | | |
|---|---|---|---|
| 2014/0145978 | A1 | 5/2014 | Hsu |
| 2017/0062528 | A1* | 3/2017 | Aoyama ........... G02F 1/133514 |

FOREIGN PATENT DOCUMENTS

| | | |
|---|---|---|
| CN | 102629176 A | 8/2012 |
| CN | 104007863 A | 8/2014 |
| CN | 104375734 A | 2/2015 |
| JP | 5075287 B1 | 11/2012 |
| KR | 20130092340 A | 8/2013 |

* cited by examiner

TOUCH SUBSTRATE, FABRICATION METHOD, TOUCH DISPLAY PANEL, AND TOUCH DISPLAY DEVICE

CROSS-REFERENCES TO RELATED APPLICATIONS

This application claims the priority of Chinese patent application No. CN201410735116.X, filed on Dec. 4, 2014, the entire content of which is incorporated herein by reference.

FIELD OF THE DISCLOSURE

The present invention generally relates to the field of display technology and, more particularly, relates to a touch substrate, a fabrication method, a touch display panel, and a touch display device.

BACKGROUND

Bridging structures are often used to transmit (to drive) or to receive (to sense) signals in x and y directions of a single layer in a touch substrate, using electrodes in the x direction and y direction on a substrate. Adjacent electrodes in x direction are connected with each other through the connection part. An insulating layer is formed in adjacent region of the adjacent electrodes in x direction. A bridging element is formed on the insulating layer. The bridging element connects adjacent electrodes in y direction through via holes.

The insulating layer is usually made of optically clear (OC) material. However, the insulating layer made of OC material may produce leakage current between electrodes in x and y directions. The OC material has a low dielectric constant (about 3.3). If a thin layer of OC material is used, interference between signals in x and y directions may occur. On the other hand, if a thick layer of OC material is used, it may affect the continuity of the bridging element over the OC layer. In addition, when being touched, it may lead to a reduced electric field lines distributed and thereby affecting touch sensitivity.

The bridging element is usually made of transparent metal or metal oxide. The insulating layer may be made of non-metallic material and may require a target material different from the metal and metal oxide used to form the bridging element. Thus, the fabrication process of conventional bridging structures has become complicated.

The disclosed touch substrates, fabrication methods, touch display panels, and touch display devices are directed to solve one or more problems set forth above and other problems in the art.

BRIEF SUMMARY OF THE DISCLOSURE

One aspect of the present disclosure includes a touch substrate. A plurality of first electrodes spaced apart by a first predetermined distance along a first direction is formed over a substrate, with adjacent first electrodes mutually connected via a connection part. A plurality of second electrodes spaced apart by a second predetermined distance along a second direction is formed over the substrate, with adjacent second electrodes mutually connected via a bridging element. An insulating layer is formed between the bridging element and the connection part. The insulating layer is formed by oxidizing a metal element sputtered from a target, which is used to form one or more of the connection part and the bridging element, in an ambient with oxygen so as to form a metal oxide layer over one of the connection part and the bridging element.

Optionally, the bridging element is formed on the substrate and sandwiched by the adjacent second electrodes in a direction parallel to the surface of the substrate, the insulating layer is formed on the bridging element, and the connection part is formed on the insulating layer to at least partially overlap, in the direction perpendicular to the surface of the substrate, with the insulating layer.

Optionally, a light-shielding layer is formed over a first surface portion of the substrate, and the plurality of first electrodes and the plurality of second electrodes are formed over a second surface portion of the substrate. Electrode wirings are formed over the light-shielding layer over the first surface portion of the substrate.

Optionally, the bridging element and the electrode wirings are formed in a single patterning process with a same material by: forming a metal-containing conductive layer over the substrate having the light-shielding layer, and patterning the metal-containing conductive layer to form the electrode wirings on the light-shielding layer and to form the bridging element on the second surface portion of the substrate.

Optionally, the insulating layer is formed on the bridging element, and then the plurality of first electrodes and the plurality of second electrodes are formed.

Optionally, the adjacent second electrodes have a top surface coplanar with a top surface of the connection part.

Optionally, the bridging element is formed on the substrate and sandwiched by the adjacent second electrodes in a direction parallel to the surface of the substrate, the insulating layer is formed on each of the bridging element and the adjacent second electrodes, and the connection part is formed on the insulating layer to at least partially overlap, in the direction perpendicular to the surface of the substrate, with the insulating layer.

Optionally, the bridging element and the adjacent second electrodes are formed by a single patterning process with a same material.

Optionally, electrode wirings are formed over a first surface portion of the substrate, and the plurality of first electrodes and the plurality of second electrodes are formed over a second surface portion of the substrate.

Optionally, the bridging element, the adjacent second electrodes, and the electrode wirings are formed by a single patterning process with a same material.

Optionally, the plurality of first electrodes and the connection part are formed over the insulating layer and over the plurality of second electrodes, after the insulating layer is formed on each of the bridging element and the adjacent second electrodes.

Optionally, the connection part is formed between the adjacent second electrodes and spaced apart from each of the adjacent second electrodes on the second surface portion of the substrate, the insulating layer is formed over the connection part and the plurality of second electrodes, and the bridging element is formed over the insulating layer and connects to each of the adjacent second electrodes through the insulating layer.

Optionally, the connection part and the plurality of second electrodes are formed in a single patterning process with a same material.

Optionally, electrode wirings are formed over a first surface portion of the substrate, and the plurality of first electrodes and the plurality of second electrodes are formed over a second surface portion of the substrate.

Optionally, the bridging element and the electrode wirings are formed in a single patterning process with a same material.

Optionally, the bridging element is formed to include a body portion and an expansion portion connected to each end of the body portion in a length direction of the body portion, and the expansion portion has a dimension in a width direction of the body portion and distanced away from a corresponding end of the body portion, the dimension in the width direction being greater than a width of the body portion.

Optionally, the bridging element is formed to include a body portion and an expansion portion connected to each end of the body portion in a length direction of the body portion, the expansion portion is in a trapezoid shape having a long side of the pair of parallel sides of the trapezoid and distanced away from a corresponding end of the body portion, and the long side of the trapezoid shape has a length greater than a width of the body portion.

Optionally, the bridging element is formed to include a body portion and an expansion portion connected to each end of the body portion in a length direction of the body portion, the expansion portion is arc-shaped having an arc part and distanced away from a corresponding end of the body portion, and the arc part of the expansion portion has a chordal length with a diameter greater than a width of the body portion.

Optionally, the bridging element and the insulating layer are formed by sharing a same metal target in a magnetron sputtering chamber. Optionally, the bridging element is formed by one metal including aluminum or metals including molybdenum and aluminum.

Optionally, the insulating layer includes an aluminum oxide layer. Optionally, the insulating layer has a dielectric constant ranging approximately from 6 to 9.

Another aspect of the present disclosure includes a touch substrate formed by the disclosed method. Another aspect of the present disclosure includes a touch display panel including the touch substrate.

Another aspect of the present disclosure includes a method of fabricating a touch substrate having a plurality of first electrodes connected by a first connection part and a plurality of second electrodes connected by a second connection part configured across the first connection part and insulated therefrom. An insulating layer is formed by oxidizing a metal element sputtered from a target in an ambient with oxygen so as to form a metal oxide layer between the first and second connection parts for electrical insulation.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the invention.

Figure 1:
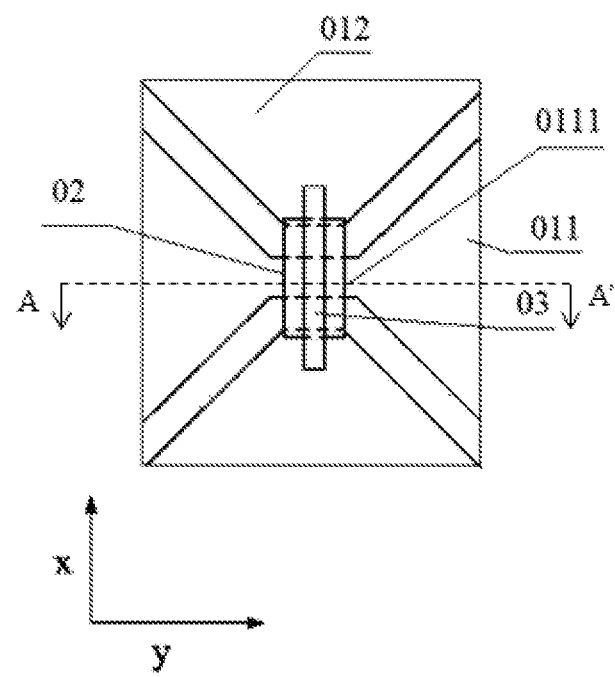
FIG. 1 illustrates a partial top view of a conventional touch substrate.
Figure 2:
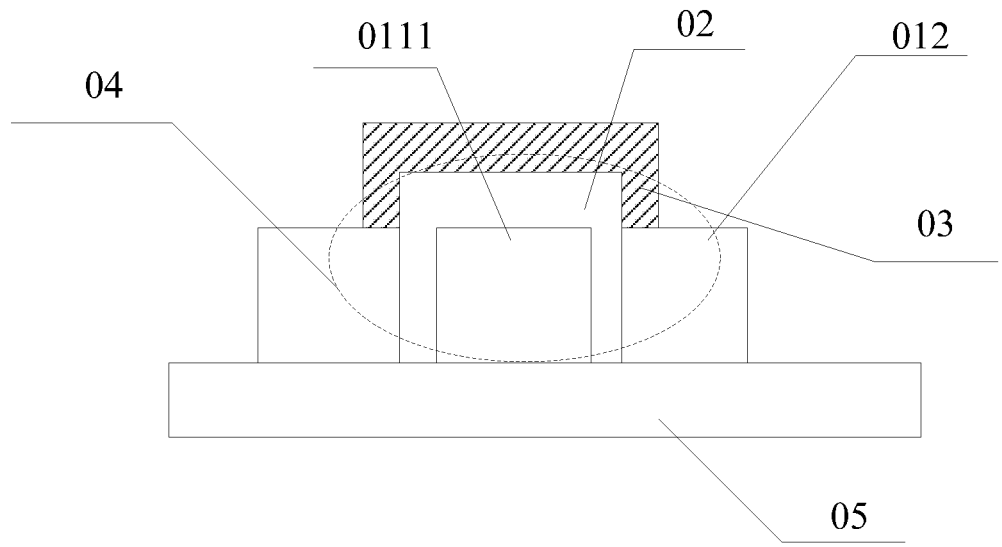
FIG. 2 illustrates a partial cross-section view along A-A' direction of the conventional touch substrate in FIG. 1.

FIG. 1 illustrates a partial top view and a partial cross-section view of a conventional touch substrate. As shown in FIGS. 1-2, a patterning process is used to form electrodes in the x direction and y direction in a same layer on a substrate 05. Adjacent electrodes 011 in x direction are directly connected with each other through the connection part 0111. An insulating layer 02 is formed in adjacent region 04 of the adjacent electrodes 011. A bridging element 03 is formed on the insulating layer 02. The bridging element 03 connects adjacent electrodes 012 in y direction through via holes. Typically, the bridging element 03 is in a rectangular shape having both ends connect to the adjacent electrodes 012. It is desirable to simplify and control fabrication process of the touch substrate including the insulating layer and the bridging element.

Various embodiments provide a touch substrate, a fabrication method of the touch substrate, a touch display panel including the touch substrate, and a touch display device including the touch display panel.

For example, a touch substrate may be formed to include a plurality of first electrodes spaced apart by a predetermined distance along a first direction over a substrate and a plurality of second electrodes spaced apart by a predetermined distance along a second direction over the substrate. A connection part may be formed over the substrate to electrically connect adjacent first electrodes. A bridging element may be formed over the substrate to electrically connect adjacent second electrodes. An insulating layer may be formed between the bridging element and the connection part in a direction perpendicular to a surface of the substrate for an electrical insulation there-between. The insulating layer may contain at least one metal element from the bridging element or the connection part. The insulating layer may be formed by oxidizing sputtered metal material of the at least one metal element to deposit the formed metal oxide layer on the bridging element and/or the connection part. In one embodiment, the oxidation process and the sputtering process of the at least one metal element are performed in one chamber.

Figure 3A:
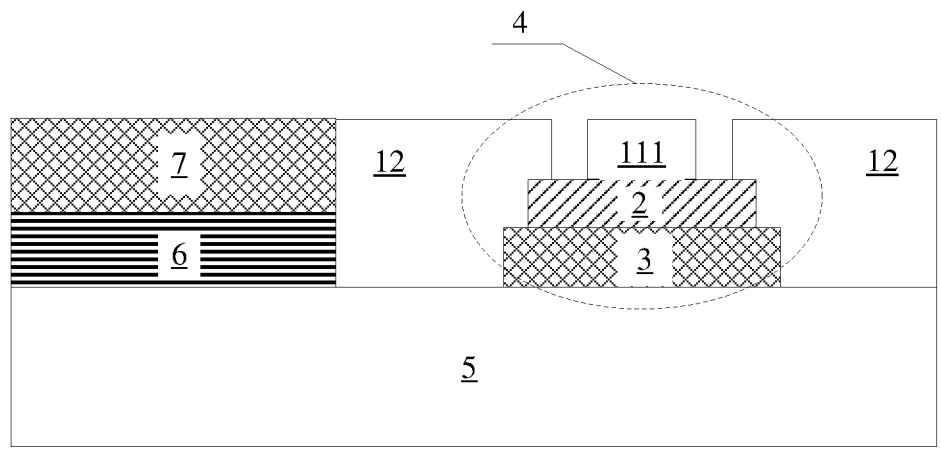
FIG. 3A illustrates a partial cross-section view of an exemplary touch substrate along b-b' direction of the exemplary touch substrate in FIGS. 4-5 according to according to various embodiments of the present disclosure.

FIGS. 3A-3C and 4-5 illustrate various exemplary touch substrates. For example, the exemplary touch substrates may include a substrate 5, a plurality of first electrodes 11 spaced apart by a predetermined distance along a first direction (e.g., y-direction shown in FIGS. 4-5) over the substrate 5, a plurality of second electrodes 12 spaced apart by a predetermined distance along a second direction (e.g., x-direction shown in FIGS. 4-5) over the substrate 5. Adjacent first electrodes 11 may be electrically connected with one another via a connection part 111 in an adjacent region 4 as shown in FIG. 3A, for example. A bridging element 3 may be formed over the substrate 5 to electrically connect adjacent second electrodes 12.

The touch substrates in FIGS. 3A-3C and 4-5 may further include a light-shielding layer 6 formed over a first surface portion of the substrate 5, while the plurality of first electrodes 11 and the plurality of second electrodes 12 are formed over a second surface portion of the substrate 5. In addition, electrode wirings 7 may be formed over the light-shielding layer 6 over the first surface portion of the substrate 5.

In various embodiments, the electrode wirings 7 may be formed between the light-shielding layer 6 and the first surface portion of the substrate 5. In other words, the light-shielding layer 6 may be formed over the electrode wirings 7. In other embodiments, the light-shielding layer 6 may not be included in the disclosed touch substrate.

In one embodiment shown in FIG. 3A, the bridging element 3 is formed on the substrate 5 and sandwiched by the adjacent second electrodes 12 in a direction parallel to the surface of the substrate 5. The insulating layer 2 is formed on the bridging element 3 having a length less than a length of the bridging element 3. The connection part 111 is formed on the insulating layer 2 to at least partially overlap with the insulating layer 2 in the direction perpendicular to the surface of the substrate 5.

For example, the bridging element 3 and the electrode wirings 7 may be formed in a single patterning process with a same material. The single patterning process is performed, after a metal-containing conductive layer is formed over the substrate 5 having the light-shielding layer 6, to pattern the metal-containing conductive layer to form the electrode wirings 7 on the light-shielding layer 6 and to form the bridging element 3 on the second surface portion of the substrate 5. The insulating layer 2 is then formed on the bridging element 3, followed by forming the plurality of first electrodes 11 and forming the plurality of second electrodes 12.

For illustration purposes, although the adjacent second electrodes 12 in FIG. 3A are shown to have a height greater than a total height of the bridging element 3 and the insulating layer 2, any suitable height of the adjacent second electrodes 12, e.g., less than or equal to a total height of the bridging element 3 and/or the insulating layer 2, may be included for the touch substrate without any limitation. The adjacent second electrodes 12 have a top surface coplanar with a top surface of the connection part 111.

Figure 3B:
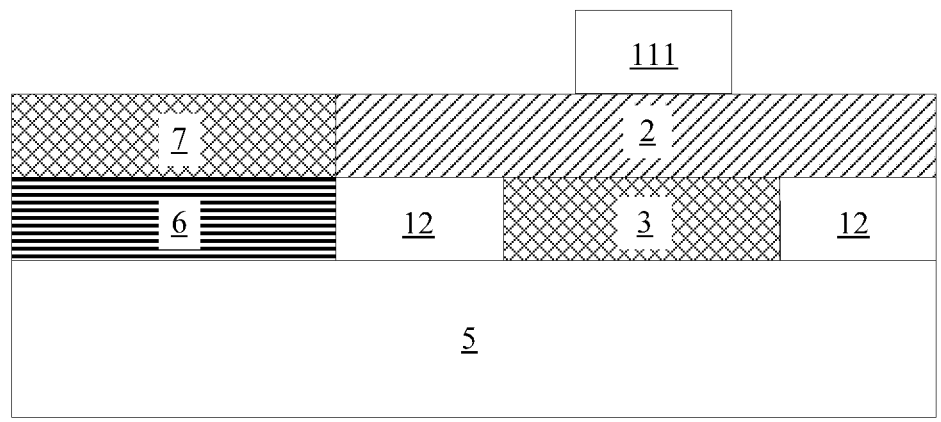
FIGS. 3B-3C illustrate a partial cross-section view of additional exemplary touch substrates according to various embodiments of the present disclosure.

In one embodiment shown in FIG. 3B, the bridging element 3 is formed on the substrate 5 and sandwiched by the adjacent second electrodes 12 in a direction parallel to the surface of the substrate 5. The insulating layer 2 is formed on each of the bridging element 3 and the adjacent second electrodes 12. The connection part 111 is formed on the insulating layer 2 to at least partially overlap with the insulating layer 2 in the direction perpendicular to the surface of the substrate 5.

In this case, the bridging element 3 and the adjacent second electrodes 12 are formed by a single patterning process with a same material on the substrate 5. Note that, in some embodiments, different materials may be used for forming the bridging element 3 and the adjacent second electrodes 12 as illustrated in FIG. 3B. In other embodiments, the bridging element 3, the adjacent second electrodes 12, and the electrode wirings 7 are formed by a single patterning process with a same material.

After the insulating layer 2 is formed on each of the bridging element 3 and the adjacent second electrodes 12, the plurality of first electrodes 11 and the connection part 111 are formed over the insulating layer 2 and over the plurality of second electrodes 12.

Figure 3C:
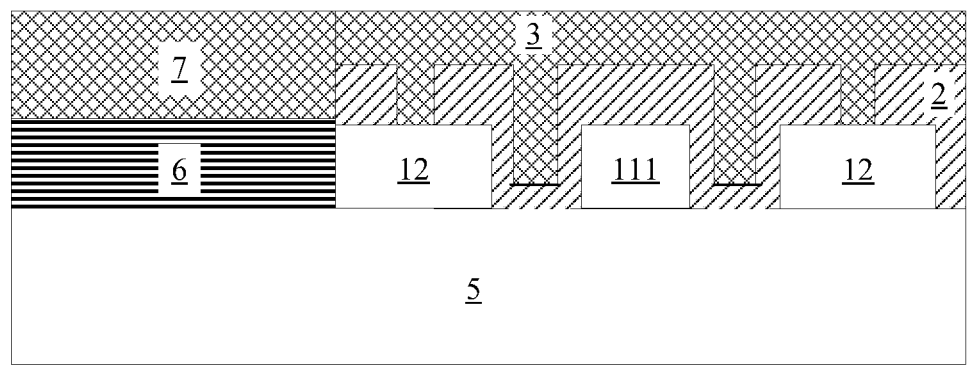

In one embodiment shown in FIG. 3C, the connection part 111 is formed between the adjacent second electrodes 12 and spaced apart from each of the adjacent second electrodes 12 on the second surface portion of the substrate 5. The insulating layer 2 is formed over the connection part 111 and the plurality of second electrodes 12. The bridging element 3 is formed over the insulating layer 2 and connects to each of the adjacent second electrodes 12 through the insulating layer 2. In this case, the connection part 111 and the plurality of second electrodes 12 are formed in a single patterning process with a same material. The bridging element 3 and the electrode wirings 7 are formed in a single patterning process with a same material.

Reference is now made to FIG. 3A and FIGS. 4-6 to describe the exemplary embodiment in great detail.

Referring back to FIG. 3A, the insulating layer 2 may be formed underlying the connection part 111 and may at least partially overlap with the connection part 111 in a direction perpendicular to a surface of the substrate.

The bridging element 3 may be formed between the insulating layer 2 and a second surface portion of the substrate 5 as shown in FIG. 3A. Adjacent second electrodes 12 may be formed on a surface portion of the substrate 5 and may be electrically connected by the bridging element 3.

In various embodiments, the bridging element 3 may be made of one or more metals or any suitable conductive materials. The insulating layer 2 may be made of a material containing at least one type of metal (also referred to as "shared metal") used to form the bridging element 3. The insulating layer 2 may have a high dielectric constant ranging from about 6 to about 9. As such, at least one metal target may be shared for fabricating the bridging element 3 and insulating layer 2 without using different metal targets. The fabrication process may then be simplified. At the same time, the shared metal target is fully utilized.

In addition, because the insulating layer 2 is formed by high K (i.e., dielectric constant) dielectric material(s) containing shared metal(s), the high dielectric constant (e.g., greater than about 3.3 such as about 6-9) may facilitate to reduce the channel leakage current between the driving electrodes and the sensing electrodes of the touch substrate. The high K dielectric material(s) containing the shared metal(s) may allow a reduced thickness of the insulating layer and may increase intensity distribution of the electric field lines when being touch sensed. Because a mutual capacitance may be formed in x and y directions by a human touch (e.g., electric field may be formed between mutual capacitors) and may be influenced by human electric field, the touch sensitivity is improved.

The bridging element may be made of a single metal or multiple metals. In one embodiment, the bridging element is made of a single metal such as an aluminum metal layer. In another embodiment, the bridging element may be made of multiple metals including molybdenum (Mo) and aluminum (Al) such as a Mo/Al/Mo layer.

Conventional bridging element may be formed in a rectangular shape, which may be deformed during fabrication process. The deformation may cause ends of the bridging element to turn into sharp tips. The antistatic capability of conventional touch unit may thus be reduced.

As disclosed herein, the bridging element may be formed to include a body portion and an expansion portion connected to each end of the body portion in a length direction of the body portion. The expansion portion may be non-rectangular shaped and may have a dimension, in a width direction of the body portion and distanced away from a corresponding end of the body portion. Such dimension of the expansion portion may be greater than the width of the body portion.

Figure 4:
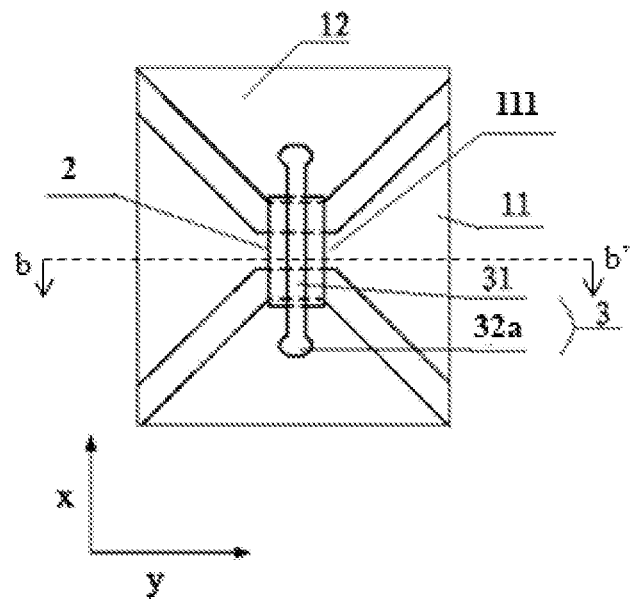
FIG. 4 illustrates a top view of an exemplary touch substrate having an arc-shaped expansion portion in a bridging element according to the first embodiment of the present disclosure.

As shown in FIG. 4, in one embodiment, the bridging element 3 may include a body portion 31 and an expansion portion 32a connected to each end of the body portion 31 in a length direction of the body portion. The expansion portion 32a may be arc-shaped. The arc part of the expansion portion 32a may be distanced away from the body portion 31. The arc-shaped expansion portion 32 may have a chordal length with a diameter greater than a width of the body portion 31 as shown in FIG. 4.

Figure 5:
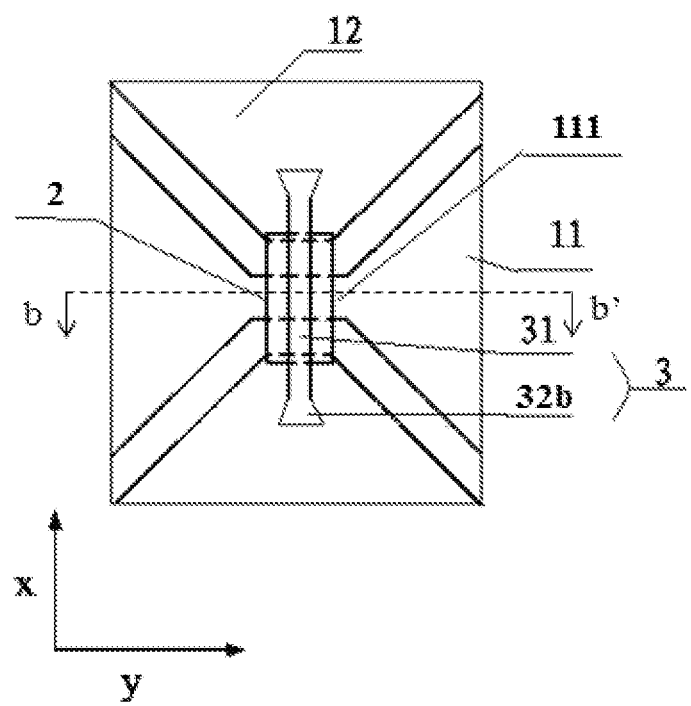
FIG. 5 illustrates a top view of an exemplary touch substrate having an trapezoid-shaped expansion portion in a bridging element according to the first embodiment of the present disclosure.

As shown in FIG. 5, in another embodiment, the bridging element may include a body portion 31 and an expansion portion 32b connected to each end of the body portion 31 in a length direction of the body portion. The expansion portion 32b may be in a trapezoid shape. The long side of the pair of parallel sides of the trapezoid may be distanced away from the body portion 31 and may have a length greater than the width of the body portion.

Note that, any suitable shape can be used for the expansion portion connected to the ends of the body portion 31 in a length direction of the body portion 31, as long as the expansion portion has a dimension (e.g., a width, a diameter, or a length) greater than the width of the body portion 31. For example, the expansion portions may be in an oval shape.

In this manner, the disclosed bridging element 3 provides expansion portions 32 (a-b) extended from ends of the body portion 31 and having a dimension greater than a width of the body portion 31. Sharp tips formed at ends of conventional bridging element due to etching inaccuracy may be avoided. Antistatic capability of the disclosed touch substrate may be improved.

Figure 6:
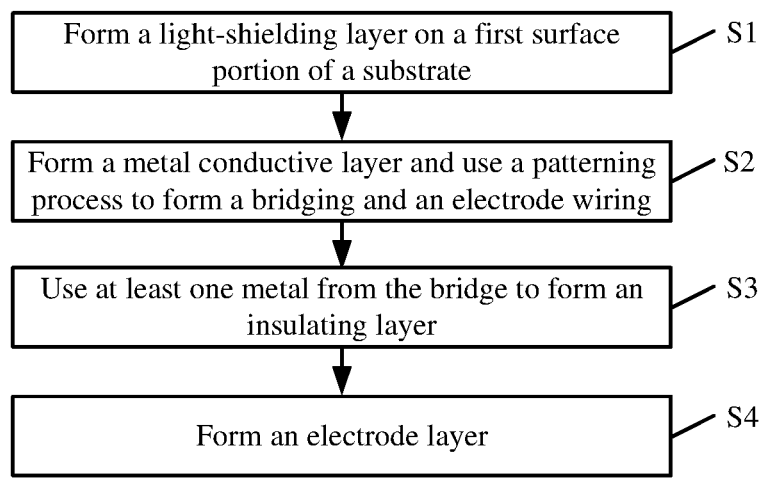
FIG. 6 illustrates a flow chart of an exemplary method for fabricating a touch substrate according to various embodiments of the present disclosure.

The present disclosure provides an exemplary method of fabricating a touch substrate. FIG. 6 illustrates a flow chart of an exemplary method for fabricating the touch substrate according to various embodiments of the present invention.

In Step S1: a patterning process is used to form a light-shielding layer (or black matrix, BM) on a substrate. For example, referring back to FIG. 3, a patterning process is used to form a light-shielding layer 6 on a first surface portion of a substrate 5. The patterning process may include a photolithographic process.

In Step S2: a conductive layer including one or more metals is formed. The conductive layer is patterned to form a bridging element and an electrode wiring over the substrate.

For example, a magnetron sputtering process may be used to bombard a molybdenum target and an aluminum target to sequentially deposit a molybdenum (Mo) conductive layer and an aluminum (Al) conductive layer on the substrate having the light-shielding layer 6 thereon (e.g., from Step S1). The Mo/Al conductive layer is then patterned to form a bridging element 3 on a second surface portion of the substrate 5 and to form an electrode wiring 7 on the light-shielding layer 6 over the substrate 5.

In other embodiments, the conductive layer may be an aluminum conductive layer. In this case, only an aluminum target sputtering may be used in this step.

In Step 3: an insulating layer containing at least one metal used to form the bridging element may be formed on the bridging element by a photolithographic process.

For example, the insulating layer may be an oxide layer of desired metals, which may be formed in the above described magnetron sputtering process. During this process, argon gas and oxygen gas may be introduced into the magnetron sputtering chamber described in step S2 to produce plasma of argon and oxygen to bombard the metal target(s) to immediately form the metal oxide layer. In various embodiments, a large amount of oxygen may be controlled and introduced into the magnetron sputtering chamber to oxidize sputtered metal element, sputtered from a target, and thus to directly deposit a metal oxide layer on the bridging element, and/or sometimes on the connection part.

Multiple metal targets may be used for forming the bridging element and the oxide layer. For example, the metal targets may include Mo target(s) and/or Al target(s). In one embodiment, about two Mo targets and about three Al targets may be placed in the magnetron sputtering chamber for forming the bridging element and then for forming metal oxide layer ready to be deposited on the bridging element.

Specifically, the magnetron sputtering chamber may have a vacuum of about 2.0E−3 Pa. The argon gas and oxygen gas may be introduced having a flow rate of about 200 sccm and about 50 sccm, respectively. The deposition process may be operated having: a quality of about 0.2 Pa, a sputtering power of about 8 KW, an operational voltage of about 400 V, and a substrate moving speed of about 1 m/min, such that the deposited aluminum oxide layer has a thickness ranging from about 100 nm to about 500 nm.

Then, a patterning process may be used to form the insulating layer 2 on the bridging element 3. The insulating layer 2 may have a length in the length direction of the bridging element 3. The length of the insulating layer 2 is shorter than the length of the bridging element 3.

In this manner, immediately after depositing the conductive layer including one or more metals on the substrate, same metal target(s) in the magnetron sputtering chamber may be used to sputter metal element for an oxidation of the sputtered metal element with sufficient oxygen in the magnetron sputtering chamber to directly deposit the oxide layer on the conductive layer.

In Step 4: an electrode layer is formed by a patterning process.

Specifically, a magnetron sputtering process may be used to deposit an electrode layer on the substrate produced in Step S3. For example, the structure produced from Step S3 may include the electrode wiring 7 formed on the light-shielding layer 6 together on the first surface portion of the substrate 5, and may also include the insulating layer 2 formed on the bridging element layer 3 together on the second portion of the substrate 5.

For example, the electrode layer may be made of indium tin oxide (ITO). Then a patterning process may be used to form a plurality of first electrodes 11 spaced apart by a predetermined distance in a first direction (e.g., in y direction shown in FIGS. 4-5 or in a direction perpendicular to the structure in FIG. 3) on the substrate 5, and a plurality of second electrodes 12 spaced apart by a predetermined distance in a second direction (e.g., in x direction shown in FIGS. 4-5 or in a horizontal direction of the structure in FIG. 3). Adjacent first electrodes 11 may be electrically connected with one another at the adjacent region 4 through the connection part 111. The connection part 111 may partially overlap with the insulating layer 2 in the direction perpendicular to the surface of the substrate 5.

In one embodiment, the bridging element 3 may be made of aluminum metal layer. The insulating layer 2 may be made of aluminum oxide (with dielectric constant ranging approximately from 6 to 9). Thus, the same aluminum target may be used in the fabrication process to reduce the types of target material that have to be used in a conventional process and to simplify the process. At the same time, the aluminum target may be fully utilized. In addition, the insulating layer made of aluminum oxide having a high K may reduce the channel leakage current between the first electrodes and the second electrodes and may improve touch sensitivity.

Alternatively, other necessary functional layers, such as I/O peripheral wirings may be included and formed over the substrate 5. It is understood that, use of metal aluminum to form the bridging element and use of aluminum oxide to form the insulating layer are described herein as an example, any other suitable pairs of metal and metal-containing insulating layer may be encompassed within the scope of present disclosure.

Various embodiments also include a touch display panel including the touch substrate described above. In addition, various embodiments include a touch display device including the touch display panel. The display device may include a display substrate used to display images, and the disclosed touch display panel. The display substrate includes a liquid crystal display (LCD) substrate, an organic light-emitting diode (OLED) display substrate, or an electronic paper display substrate.

For example, the formed touch substrate may be flipped to be configured with an LCD substrate to form the touch display device. In another example, the formed touch substrate may be configured with a glass substrate to form a touch display panel, which is then configured with an LCD substrate to form a touch display device.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method of fabricating a touch substrate, comprising:
forming a plurality of first electrodes spaced apart by a first predetermined distance along a first direction over a substrate, with adjacent first electrodes mutually connected by a connection part;
forming a plurality of second electrodes spaced apart by a second predetermined distance along a second direction over the substrate, with adjacent second electrodes mutually connected by a bridging element; and
forming an insulating layer between the bridging element and the connection part,
wherein the insulating layer is formed by oxidizing a metal element sputtered from a target, which is used to form one or more of the connection part and the bridging element, in an ambient with oxygen so as to form a metal oxide layer over one of the connection part and the bridging element.

2. The method of claim 1, wherein:
the bridging element is formed on the substrate and sandwiched by the adjacent second electrodes in a direction parallel to the surface of the substrate,
the insulating layer is formed on the bridging element, and the connection part is formed on the insulating layer to at least partially overlap, in the direction perpendicular to the surface of the substrate, with the insulating layer.

3. The method of claim 2, further comprising:
forming a light-shielding layer over a first surface portion of the substrate, wherein the plurality of first electrodes and the plurality of second electrodes are formed over a second surface portion of the substrate; and
forming electrode wirings over the light-shielding layer over the first surface portion of the substrate.

4. The method of claim 3, wherein the bridging element and the electrode wirings are formed in a single patterning process with a same material by:
forming a metal-containing conductive layer over the substrate having the light-shielding layer, and
patterning the metal-containing conductive layer to form the electrode wirings on the light-shielding layer and to form the bridging element on the second surface portion of the substrate.

5. The method of claim 4, further comprising:
forming the insulating layer on the bridging element, and then forming the plurality of first electrodes and forming the plurality of second electrodes.

6. The method of claim 1, wherein:
the bridging element is formed on the substrate and sandwiched by the adjacent second electrodes in a direction parallel to the surface of the substrate,
the insulating layer is formed on each of the bridging element and the adjacent second electrodes, and
the connection part is formed on the insulating layer to at least partially overlap, in the direction perpendicular to the surface of the substrate, with the insulating layer.

7. The method of claim 6, wherein the bridging element and the adjacent second electrodes are formed by a single patterning process with a same material.

8. The method of claim 6, further comprising:
forming electrode wirings over a first surface portion of the substrate, wherein the plurality of first electrodes and the plurality of second electrodes are formed over a second surface portion of the substrate.

9. The method of claim 8, wherein the bridging element, the adjacent second electrodes, and the electrode wirings are formed by a single patterning process with a same material.

10. The method of claim 6, wherein:
the plurality of first electrodes and the connection part are formed over the insulating layer and over the plurality of second electrodes, after the insulating layer is formed on each of the bridging element and the adjacent second electrodes.

11. The method of claim 1, wherein:
the connection part is formed between the adjacent second electrodes and spaced apart from each of the adjacent second electrodes on the second surface portion of the substrate,
the insulating layer is formed over the connection part and the plurality of second electrodes, and
the bridging element is formed over the insulating layer and connects to each of the adjacent second electrodes through the insulating layer.

12. The method of claim 11, wherein:
the connection part and the plurality of second electrodes are formed in a single patterning process with a same material.

13. The method of claim 11, further comprising:
forming electrode wirings over a first surface portion of the substrate, wherein the plurality of first electrodes and the plurality of second electrodes are formed over a second surface portion of the substrate.

14. The method of claim 13, wherein:
the bridging element and the electrode wirings are formed in a single patterning process with a same material.

15. The method of claim 1, wherein:
the bridging element is formed to include a body portion and an expansion portion connected to each end of the body portion in a length direction of the body portion, and
the expansion portion has a dimension in a width direction of the body portion and distanced away from a corresponding end of the body portion, the dimension in the width direction being greater than a width of the body portion.

16. The method of claim 1, wherein:
the bridging element is formed to include a body portion and an expansion portion connected to each end of the body portion in a length direction of the body portion,
the expansion portion is in a trapezoid shape having a long side of the pair of parallel sides of the trapezoid and distanced away from a corresponding end of the body portion, and
the long side of the trapezoid shape has a length greater than a width of the body portion.

17. The method of claim 1, wherein:
the bridging element is formed to include a body portion and an expansion portion connected to each end of the body portion in a length direction of the body portion,
the expansion portion is arc-shaped having an arc part and distanced away from a corresponding end of the body portion, and
the arc part of the expansion portion has a chordal length with a diameter greater than a width of the body portion.

18. The method of claim 1, wherein the bridging element and the insulating layer are formed by sharing a same metal target in a magnetron sputtering chamber, and the bridging element is formed by one metal including aluminum or metals including molybdenum and aluminum.

19. The method of claim 1, wherein the insulating layer has a dielectric constant ranging approximately from 6 to 9.

* * * * *